United States Patent
Verbunt (10) Patent No.: US 6,897,152 B2
(45) Date of Patent: May 24, 2005

(54) COPPER BATH COMPOSITION FOR ELECTROLESS AND/OR ELECTROLYTIC FILLING OF VIAS AND TRENCHES FOR INTEGRATED CIRCUIT FABRICATION

(75) Inventor: Han Verbunt, Helmond (NL)

(73) Assignee: Enthone Inc., West Haven, CT (US)

(*) Notice: Subject to any disclaimer, the term of this patent is extended or adjusted under 35 U.S.C. 154(b) by 0 days.

(21) Appl. No.: 10/358,596

(22) Filed: Feb. 5, 2003

(65) Prior Publication Data

US 2004/0152303 A1 Aug. 5, 2004

(51) Int. Cl.$^7$ .......................... H01L 21/445; C25D 3/38
(52) U.S. Cl. ...................... 438/687; 438/675; 438/678; 205/157; 205/295; 205/296
(58) Field of Search ................ 438/675, 678, 438/687; 205/157, 295, 296, 297, 298

(56) References Cited

U.S. PATENT DOCUMENTS

| | | | | |
|---|---|---|---|---|
| 4,211,564 A | * | 7/1980 | Oka | 106/1.23 |
| 4,443,257 A | * | 4/1984 | Tomaiuolo et al. | 106/1.23 |
| 4,617,205 A | | 10/1986 | Darken | |
| 5,252,196 A | * | 10/1993 | Sonnenberg et al. | 205/296 |
| 5,453,293 A | * | 9/1995 | Beane et al. | 427/96 |
| 5,891,513 A | * | 4/1999 | Dubin et al. | 427/98 |
| 6,024,856 A | | 2/2000 | Haydu et al. | |
| 6,183,545 B1 | * | 2/2001 | Okuhama et al. | 106/1.18 |
| 6,258,223 B1 | * | 7/2001 | Cheung et al. | 204/242 |
| 6,271,591 B1 | * | 8/2001 | Dubin et al. | 257/751 |
| 6,319,543 B1 | * | 11/2001 | Soutar et al. | 427/98 |
| 6,528,409 B1 | * | 3/2003 | Lopatin et al. | 438/618 |
| 2002/0011176 A1 | | 1/2002 | Yoshida et al. | |
| 2002/0064592 A1 | | 5/2002 | Datta et al. | |
| 2002/0152955 A1 | | 10/2002 | Dordi et al. | |
| 2003/0054094 A1 | | 3/2003 | Itabashi et al. | |

FOREIGN PATENT DOCUMENTS

| | | |
|---|---|---|
| EP | 1 160 356 A1 | 12/2001 |
| JP | 07-268638 A | 10/1995 |
| WO | WO 01/46494 A1 | 6/2001 |

OTHER PUBLICATIONS

Hsu, D.T. et al., "Change in chemical state of fluorinated polyimides after the electroless Cu deposition solution treatment", Journal of Material Science Letters 18 (1999), pp. 1465–1467.

* cited by examiner

Primary Examiner—Stephen W. Smoot
(74) Attorney, Agent, or Firm—Senniger Powers (57) ABSTRACT

The present invention is directed to a copper bath composition and a process for the electroless and/or electrolytic plating of copper to fill vias and trenches during the manufacture of integrated circuits. Specifically, the copper bath composition comprises water, copper ions, hydroxide ions, a complexing agent to inhibit the formation of copper oxides, copper hydroxides and copper salts, a stabilizer to control the rate of electroless copper plating, a reducing agent to promote the electroless reduction of the copper ions to copper metal, and a catalyst to promote the electrolytic reduction copper ions to copper metal.

53 Claims, 3 Drawing Sheets

COPPER BATH COMPOSITION FOR ELECTROLESS AND/OR ELECTROLYTIC FILLING OF VIAS AND TRENCHES FOR INTEGRATED CIRCUIT FABRICATION

BACKGROUND OF THE INVENTION

This invention relates to the deposition of a copper onto the surface of a semiconductor substrate comprising vias and trenches and, in particular, to the electroless and electrolytic plating of copper onto a copper seed layer in the vias and trenches using the same copper bath.

An integrated circuit (IC) contains a collection of electrical devices, such as transistors, capacitors, resistors, and diodes, within a dielectric material on a semiconductor. Conductive interconnects connecting discrete devices are referred to as trenches. Additionally, two or more conductive layers, each separated by a dielectric, are typically employed within a given IC to increase its overall performance. Conductive interconnects known as vias are used to connect these distinct conductive layers together. Currently, ICs typically have silicon oxide as the dielectric material and copper as the conductive material.

The demand for manufacturing semiconductor IC devices such as computer chips with high circuit speed, high packing density and low power dissipation requires the downward scaling of feature sizes in ultra-large-scale integration (ULSI) and very-large-scale integration (VLSI) structures. The trend to smaller chip sizes and increased circuit density requires the miniaturization of interconnect features, which severely penalizes the overall performance of the structure because of increasing interconnect resistance and reliability concerns such as electromigration.

Traditionally, such structures had used aluminum and aluminum alloys as the metallization on silicon wafers with silicon dioxide being the dielectric material. In general, openings are formed in the dielectric layer in the shape of vias and trenches after metallization to form the interconnects. Increased miniaturization is reducing the openings to submicron sizes (e.g., 0.5 micron and lower).

To achieve further miniaturization of the device, copper has been introduced to replace aluminum as the metal to form the connection lines and interconnects in the chip. Copper metallization is carried out after forming the interconnects. Copper has a lower resistivity than aluminum and the thickness of a copper line for the same resistance can be thinner than that of an aluminum line. Copper-based interconnects, therefore, represent the future trend in the fabrication of such devices.

The use of copper has introduced a number of requirements into the IC manufacturing process. First, copper has a tendency to diffuse into the semiconductor's junctions, thereby disturbing their electrical characteristics. To combat this occurrence, a barrier layer, such as titanium nitride, tantalum or tantalum nitride, is applied to the dielectric prior to the copper layer's deposition. It is also necessary that the copper be deposited on the barrier layer cost-effectively while ensuring the requisite coverage thickness for carrying signals between the IC's devices. As the architecture of ICs continues to shrink, this requirement proves to be increasingly difficult to satisfy.

One conventional semiconductor manufacturing process is the copper damascene system. Specifically, this system begins by etching the circuit architecture into the substrate's dielectric material. The architecture is comprised of a combination of the aforementioned trenches and vias. Next, a barrier layer is laid over the dielectric to prevent diffusion of the subsequently applied copper layer into the substrate's junctions. Copper is then deposited onto the barrier layer using one of a number of processes, including, for example, chemical vapor deposition (CVD), physical vapor deposition (PVD), or electrochemical deposition. After the copper layer has been deposited, excess copper is removed from the facial plane of the dielectric, leaving copper in only the etched interconnect features of the dielectric. Subsequent layers are produced similarly before assembly into the final semiconductor package.

Electrochemical deposition, the currently preferred method for applying copper, requires deposition of a thin copper seed layer prior to electrochemical deposition so that the copper has an electrically conductive surface on which to deposit. The copper seed layer is typically applied by PVD or CVD, both of which often have coverage problems, especially in interconnects in the device, such that the copper seed layer is non-continuous and has voids and gaps. These voids and gaps in the copper seed layer impair the ability to subsequently deposit a continuous copper layer by electrochemical deposition. The copper seed layer is typically exposed to an activator liquid to fill in the voids and gaps in the seed layer. For example, the seed layer may be exposed to palladium-tin colloidal suspension to deposit palladium-tin particles on the seed layer and fill the voids and gaps in the seed layer. The deposited palladium carries current across the voids and gaps, thereby facilitating subsequent electrochemical deposition of a continuous copper layer.

Subsequent to activation of the seed layer, a copper seed enhancement layer is typically deposited using an electroless copper plating solution. After deposition of the seed enhancement layer, the filling of the vias and trenches is completed by depositing copper electrolytically using an electrolytic copper plating solution. After depositing the copper seed enhancement layer, typically about 99 percent of their depth remains unfilled. Thus, the majority of the filling process occurs during the electrolytic plating operation.

Although widely used, electrochemical copper deposition processes have drawbacks. For example, each step requires a different plating solution followed by a water rinse before being immersed in the next plating solution. This typically results in increased raw material costs, increased waste disposal costs, increased manufacturing duration, increased capital investment and increased manufacturing costs all of which increase the cost of each integrated circuit. Thus, a need continues to exist for a less expensive, and more consolidated electrochemical copper deposition process.

SUMMARY OF THE INVENTION

Among the several objects of this invention, therefore, is the provision of a solution and process for the electroless and electrolytic plating of copper to fill vias and trenches for the manufacture of integrated circuits; and the provision of an electrochemical copper deposition process which reduces raw material costs, waste disposal costs, decrease manufacturing duration, decreases capital investment costs, and decreases manufacturing costs compared to a conventional two solution electrochemical process.

Briefly, therefore, the invention is directed to a copper plating solution for the electroless or the electrolytic deposition of copper onto a surface of an integrated circuit semiconductor substrate. The copper plating solution comprises water, copper ions, hydroxide ions, a complexing agent to inhibit the formation of copper oxides, copper hydroxides and copper salts, a stabilizer to control the rate of electroless copper plating, a reducing agent to promote the electroless reduction of the copper ions to copper metal, and a catalyst to promote the electrolytic reduction copper ions to copper metal.

The present invention is also directed to copper plating solution for the electroless or electrolytic deposition of copper onto a surface of a substrate. The copper plating solution comprising water, copper ions, a formaldehyde-free reducing agent to promote the electroless reduction of the copper ions to copper metal, and an alkali metal-free hydroxide. The solution also comprises a complexing agent that is a hydroxy lower alkyl lower alkylene amine, diamine, triamine, polyamine, or imine. An organic nitrogen-containing compound selected from the group consisting of 2,2'bipyridyl, hydroxypyridine, and 2'2-dipyridylamine is also included in the solution. Further, the solution comprises an organic divalent sulfur-containing compound selected from the group consisting of 2-mercaptothiazoline, 2-mercaptobenzothiazole, 2-mercaptopyridine, and allyl thiourea.

Additionally, the present invention is directed to a copper plating solution for the electroless or electrolytic deposition of copper onto a surface of a substrate that comprises water, copper ions at a concentration between about 0.02 and about 0.06 M, ethylenediaminetetraacetic acid at a concentration between about 0.04 and about 0.08 M with the molar ratio of copper ions to ethylenediaminetetraacetic acid being between about 1:1 and about 1:1.5. The solution also comprises glyoxylic acid at a concentration between about 0.07 and about 0.14 M. The solution further comprises tetramethylammonium hydroxide at a concentration between about 1.20 and about 2.20 M with the concentration of tetramethylammonium hydroxide being such that the copper plating solution comprises at least about 10 g/l of tetramethylammonium hydroxide that is unreacted after neutralization of acid in the copper plating solution. Additionally, the solution comprises 2,2'bipyridyl at a concentration between about 0.006 and about 0.064 mM, and 2-mercaptothiazoline at a concentration between about 0.0004 and about 0.004 mM.

Further, the present invention is directed to a process for electrolessly plating copper onto a surface of an integrated circuit semiconductor substrate. The process comprises contacting the surface with a copper plating solution to electrolessly deposit copper onto the surface of the integrated circuit semiconductor substrate. This is accomplished using a copper plating solution comprising water, copper ions, hydroxide ions, a complexing agent to inhibit the formation of copper oxides, copper hydroxides and copper salts, a stabilizer to control the rate of electroless copper plating, a reducing agent to promote the electroless reduction of the copper ions to copper metal, and a catalyst to promote the electrolytic reduction copper ions to copper metal.

The present invention is also directed to a process for electroless plating of copper onto a surface of substrate that comprises contacting the surface with a copper plating solution to electrolessly deposit copper onto the surface of the substrate. The copper plating solution comprises water, copper ions, and a complexing agent that is a hydroxy lower alkyl lower alkylene amine, diamine, triamine, polyamine, or imine. Additionally, the solution comprises a formaldehyde-free reducing agent to promote the electroless reduction of the copper ions to copper metal. An alkali metal-free hydroxide is included in the solution along with an organic nitrogen-containing compound selected from the group consisting of 2,2'bipyridyl, hydroxypyridine, and 2'2-dipyridylamine, and an organic divalent sulfur-containing compound selected from the group consisting of 2-mercaptothiazoline, 2-mercaptobenzothiazole, 2-mercaptopyridine, and allyl thiourea.

Still further, the present invention is directed to a process for electrolytic plating of copper onto a surface of an integrated circuit semiconductor substrate. The process comprises contacting the surface with a copper plating solution and applying an external source of electrons to the copper plating solution to electrolytically deposit copper onto the surface. The copper plating solution comprises water, copper ions, hydroxide ions, a complexing agent to inhibit the formation of copper oxides, copper hydroxides and copper salts, a stabilizer to control the rate of electroless copper plating, a reducing agent to promote the electroless reduction of the copper ions to copper metal, and a catalyst to promote the electrolytic reduction copper ions to copper metal.

The present invention is additionally directed to a process for plating copper onto a substrate. The process comprises contacting the substrate with a copper plating solution to electrolessly deposit an electroless copper layer onto the substrate. The copper plating solution comprises water, copper ions, hydroxide ions, a complexing agent to inhibit the formation of copper oxides, copper hydroxides and copper salts, a stabilizer to control the rate of electroless copper plating, a reducing agent to promote the electroless reduction of the copper ions to copper metal, and a catalyst to promote the electrolytic reduction copper ions to copper metal. After electrolessly depositing copper, the process comprises applying an external source of electrons to the copper plating solution to electrolytically deposit an electrolytic copper layer onto the electroless copper layer.

Other objects and features of the invention will be in part apparent, and in part described hereafter.

DETAILED DESCRIPTION OF THE INVENTION

The present invention is directed to a copper bath composition which can be used for electroless and/or electrolytic filling of vias and trenches for the manufacture of integrated circuits and a method of using the same. Specifically, the invention involves a bath, or solution, comprising copper ions which, when contacted with a surface such as a barrier layer, electrolessly deposits a copper seed layer. Further, the copper bath may be used to deposit an enhancement layer onto a copper seed layer. Also, if an electrical potential is applied to the surface while in contact with the bath, copper is electrolytically plated onto the surface.

The copper plating solution of the present invention comprises water, copper ions, a reducing agent, hydroxide ions, a complexing agent, a stabilizer, and if used for electrolytic plating, a catalyst.

The copper ions preferably have a valency of +2. Any appropriate electronics grade copper-containing compound may be used to supply the copper ions. For example, the copper-containing compound is preferably selected from the group consisting of copper (II) sulphate, copper (II) chloride, copper (II) acetate, copper (II) nitrate, copper (II) carbonate, copper (II) hydroxide, copper (II) iodide, and hydrates of the foregoing compounds. In a particularly preferred embodiment of the present invention the copper-containing compound is copper (II) sulphate pentahydrate ($CuSO_4 \cdot 5H_2O$). The concentration of copper ions in the solution is preferably between about 0.008 and about 0.08 M, and more preferably between about 0.02 and about 0.06 M. Thus, the amount of copper (II) sulphate pentahydrate in the copper plating solution is preferably between about 2 and about 20 g/l, and more preferably between about 5 and about 15 g/l.

The copper plating solution of the present invention comprises a reducing agent that reduces the copper (II) ions to copper metal to enable electroless plating. Traditionally, electroless copper baths used formaldehyde as the reducing agent, however, due to toxicity concerns it is not preferred. See U.S. Pat. No. 4,617,205 which is hereby incorporated by reference for all purposes. The copper plating solution of the present invention utilizes a reducing agent which is considerably less toxic than formaldehyde. Preferably, the reducing agent of the present invention is selected from the group consisting of glyoxylic acid, dimethylamine borane (DMAB), hypophosphite, borohydride, hydrazine and mixtures thereof. The hypophosphite and borohydride may be present as sodium, potassium, lithium and ammonium salts. Another source of hypophosphite is hypophosphorous acid. Hydrazine sources include hydrazine and the chloride, sulphate and acetate salts of hydrazine. In a preferred embodiment of the present invention, the reducing agent is glyoxylic acid and the concentration of the glyoxylic acid in the solution is between about 0.027 and about 0.27 M (between about 2 and about 20 g/l). In another preferred embodiment, the concentration of the glyoxylic acid is between about 0.07 and about 0.14 M (between about 5 and about 10 g/l).

The hydroxide ions are included in the plating solution to neutralize the hydrogen ions (H+) generated, e.g., by the copper compounds, the complexing agent, and the reducing agent. Additionally, the hydroxide ions participate in the chemical reduction of the copper ions to copper metal. Preferably, the hydroxide ions are supplied from tetramethylammonium hydroxide (TMAH). Although other hydroxide source compounds may be used (e.g., NaOH, KOH, LiOH, etc.), the bath preferably does not contain any mobile ions such as alkali metal ions which may be critical contaminants for CMOS devices, thus, any other hydroxide-containing compounds included in the solution are preferably substantially free of alkali metal atoms and/or ions (i.e., the compounds of the solution do not contain more than the typical impurity level of alkali metal atoms and/or ions for electronics grade materials).

The concentration of TMAH in the copper plating solution is preferably between about 0.39 and about 2.64 M (between about 35 and about 240 g/l). More preferably, the concentration of TMAH in the copper plating solution is between about 1.20 and about 2.20 M (between about 110 and about 200 g/l). Also, the concentration of the TMAH in the copper plating solution is preferably sufficient to yield at least about 10 g/l of unreacted TMAH in the solution after all the acids have been neutralized by the TMAH (e.g., acids from copper compounds, EDTA, and glyoxylic acid). Typically, the pH of the solution is between about 10 and about 14. In one embodiment, the pH of the solution is between about 12.5 and about 13.

The complexing agent is included in the plating solution to prevent the precipitation of copper oxides, copper hydroxides, and insoluble copper salts (e.g., copper oxalate). Preventing the precipitation of copper oxalate is significant because when glyoxylic acid functions as a reducing agent it is oxidized to oxalic acid which can result in a build-up of oxalate ions when the bath is in use. If formed in the plating solution, such precipitates may deposit on the substrate, become incorporated in the copper plate, and result in a rough surface. If the concentration of precipitates is great enough, the layer deposited on the substrate can be powdery and not adhere to the substrate. In general, the complexing agent is capable of forming stable, water-soluble copper complexes under conditions of high pH (e.g., a pH of 12 and higher) and high temperature (e.g., up to boiling). The complexing agent also keeps the concentration of free copper ions low, which tends to prevent decomposition of the bath. The preferred complexing agent is ethylenediaminetetraacetic acid (EDTA), however, other complexing agents may be used with, or in place of, EDTA. Examples of other complexing agents include: hydroxy lower alkyl lower alkylene amines, diamines, triamines and other polyamines or imines, such as tetra-2-hydroxypropyl ethylene diamine (EDTP); lower alkyl carboxylic acid lower alkylene amines, diamines, triamines or polyamines or imines, such as diethylene triamine pentaacetic acid; compounds which have attributes of the foregoing two classes of compounds, e.g., hydroxyalkyl or alkylene carboxylic acid amines, triamines, polyamines or imines, such as N-2-hydroxyethyl ethylene diamine-N,N',N'-triacetic acid; hydroxy mono-, di-, tri- or tetra-carboxylic acids, having, for example, 1 to 6 carbon atoms other than in the carboxylic groups, e.g., gluconate and glucoheptonate; nitrilotriacetic acid; glycollic acid; iminodiacetic acid; polyimines; and ethanolamine.

Any appropriate EDTA-containing compound may be used to supply the EDTA. For example, the EDTA may be supplied as the acid itself and as EDTA-containing salts such as EDTA-(mono, di, tri, or tetra)-(sodium, potassium, or ammonium) salts. Preferably, the EDTA is supplied as the acid itself. The concentration of EDTA in the solution is preferably between about 0.012 and about 0.12 M (between about 3 and about 30 g/l). More preferably, the concentration of EDTA is between about 0.04 and about 0.08 M (between about 10 and about 20 g/l). To ensure the efficient plating of copper, the concentrations of the copper ions and the EDTA are preferably controlled so that the molar ratio of copper to EDTA is between about 1:1 and about 1:2, and more preferably between about 1:1 and about 1:1.5.

The plating solution also comprises one or more stabilizer compounds to stabilize the solution and control the plating rate during electroless deposition. A stabilizer compound typically forms strong copper (I) complexes that tend to inhibit the formation of copper (I) oxide. An electroless copper stabilizer causes the plating rate at a given copper surface to diminish as the plating time increases. Thus, one reason for including a stabilizer is to prevent uncontrolled copper plating which would rapidly exhaust the plating solution. Specifically, copper particles or solid impurities that may form in the solution will be plated because the electroless plating of copper is autocatalytic, and if the particles are not stabilized, the plating will continue indefinitely until the solution is exhausted. Another benefit of including a stabilizer is that they tend to refine the grain structure of, and improve the ductility of, the plated copper thereby improving the visual appearance of the deposit and enabling easier inspection. Combinations of such stabilizer compounds may be found to be especially preferred. In one embodiment, the plating solution comprises 2,2'bipyridyl as a stabilizer compound. The concentration of 2,2'bipyridyl in the copper plating solution is preferably between about 0.006 and about 0.128 mM (between about 1 and about 20 g/l). More preferably, the concentration of 2,2'bipyridyl in the copper plating solution is between about 0.006 and about 0.064 mM (between about 1 and about 10 mg/l). The 2,2'bipyridyl may be supplied to the solution as itself and/or by an appropriate organic nitrogen-containing compounds such as hydroxypyridine and 2,2'-dipyridylamine. A further reason for including a stabilizer is that they can be used to control the electroless plating rate. For example, 2,2'bipyridyl tends to enhance the plating rate during electroless deposition.

Optionally, the plating solution may comprise a catalyst to ensure that electrolytically deposited copper is well adhered and not powdery. In conventional electrolytic plating, there is no danger of copper (I) oxide formation because the electrolytic plating solution will not comprise a reducing agent and the plating reaction will only take place at the electrodes. During electrolytic plating, copper (I) ions are formed at the cathode and the catalyst is included to ensure that the copper (I) ions are reduced to copper metal before the ions can migrate from the cathode and form insoluble copper (I) oxide precipitates. Organic sulfur-containing compounds in which the sulfur is divalent are particularly well suited catalysts for electrolytic copper plating. Such organic sulfur compounds include 2-mercaptothiazoline (2-MTA), 2-mercapobenzothiazole, 2-mercaptopyridine, and allyl thiourea. Advantageously, a catalyst such as 2-MTA also acts as a stabilizer and as a deposition rate controller during electroless copper plating by decreasing the plating rate. Thus, in one embodiment of the present invention 2-MTA is included in the plating solution that may be used for electroless and electrolytic deposition of copper. The concentration of 2-MTA in the copper plating solution is preferably less than about 0.84 mM (less than about 10 mg/l), e.g., between about 0.006 and about 0.128 mM. More preferably, the concentration of 2-MTA is between about 0.0004 and about 0.004 mM (between about 0.05 and about 0.5 mg/l).

During a plating operation (electroless and/or electrolytic), the copper plating solution is preferably maintained at a temperature between about 20 and about 90° C., and more preferably between about 60 and about 80° C. The copper plating solution preferably electrolessly plates at a rate between about 3 and about 6 $\mu$m/hr. As such, to deposit copper on a substrate by electroless deposition, the substrate is typically immersed in, or contacted with, the copper plating solution for a duration that is between about 10 seconds and about 10 minutes. More preferably, the substrate is immersed in the solution for a duration between about 10 and about 60 seconds. In one embodiment of electrolytic plating, the current density is between about 0.01 and about 5 A/dm$^2$ and the plating rate that is between about 0.13 and about 70 $\mu$m/hr. In another embodiment of electrolytic plating, the current density is between about 0.25 and about 1 A/dm$^2$ and the plating rate is between about 3.0 and about 13 $\mu$m/h. Typically, the thickness of the electrolytically deposited copper is between about 0.1 and about 3 $\mu$m which, in view of the foregoing plating rates, corresponds to the substrate being immersed in the solution for a duration between about 30 seconds and about 10 minutes in the former embodiment, and between about 3 and about 6 minutes in the latter embodiment.

Figure 1:
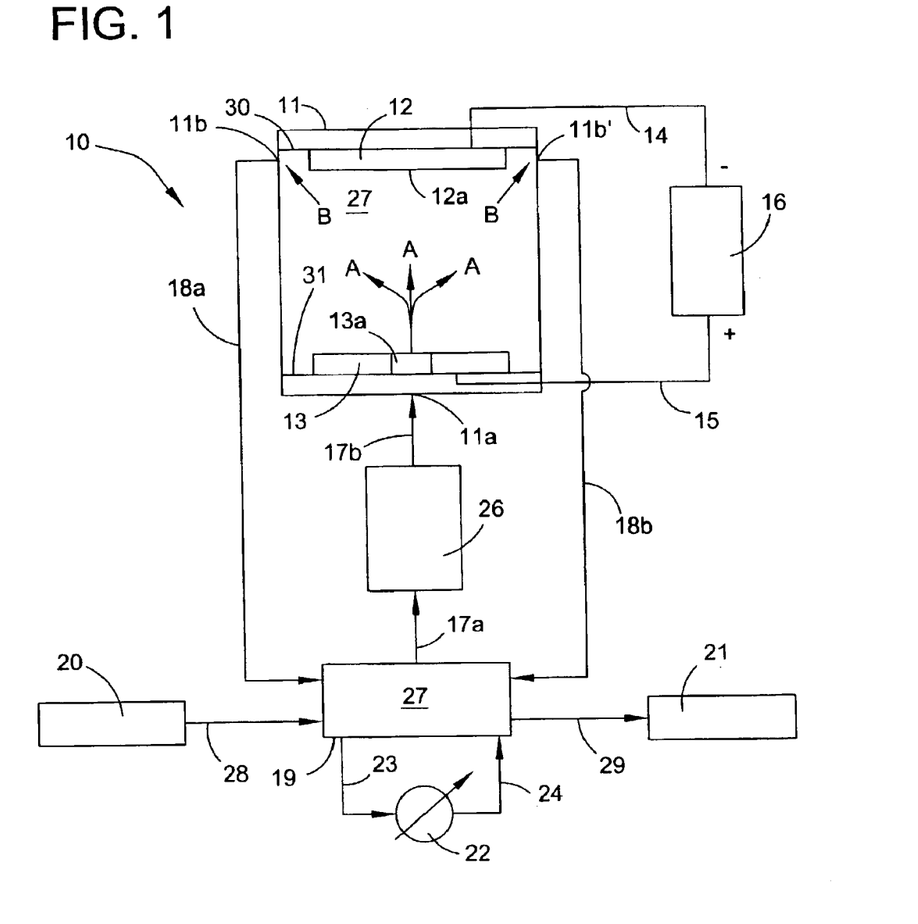
FIG. 1 is a schematic diagram of a preferred plating system in which the copper bath composition of the present invention may be used.

Referring to FIG. 1, one preferred plating system for carrying out the invention is shown generally as 10 and is used for electroplating copper onto a substrate 12. The plating system 10 and method are described with reference to plating a silicon wafer using an insoluble anode but it will be appreciated by those skilled in the art that other plating arrangements may be used.

The plating system 10 comprises an electroplating tank 11 which holds copper electrolyte 27 and which is made of a suitable material such as plastic or other material inert to the electrolytic plating solution. The tank is preferably cylindrical especially for wafer plating. A cathode 12 is horizontally disposed at the upper part of tank 11 and may be any type substrate such as a silicon wafer having openings such as trenches and vias. An anode 13 is also preferably circular for wafer plating and is horizontally disposed at the lower part of tank 11 forming a space between the anode 13 and cathode 12. The anode 13 is typically a soluble anode, but may also be an insoluble anode which is not consumed in the process.

The cathode substrate 12 and anode 13 are electrically connected by wiring 14 and 15, respectively, to a rectifier (power supply) 16. The cathode substrate 12 for direct or pulse current has a net negative charge so that copper ions in the solution are reduced at the cathode substrate forming plated copper metal on the cathode surface 12a. An oxidation reaction takes place at anode 13. The cathode 12 and anode 13 are shown horizontally disposed but may also be vertically disposed in the tank 11. An electrolyte holding tank 19 contains copper electrolyte 27 which is recycled from holding tank 19 through line 17a, filter 26 and line 17b to the inlet 11a of electroplating tank 11. The electrolyte 27 as it enters the tank moves through an opening 13a in anode 13 and moves as shown by arrows A upward to the outlets 11b and 11b' of electroplating tank 11. The anode is positioned on plate 31. Arrows B show electrolyte being removed from holding tank 11 through outlets 11b and 11b' into recycle transfer lines 18a and 18b. It is preferred that outlets 11b and 11b' be proximate the edge of surface 12a of cathode 12 and more preferred that the outlet be a continuous opening around the periphery of the electroplating tank so that the flow of electrolyte impinging on the cathode surface is uniform across the cathode surface and the electrolyte overflows the opening and is directed to holding tank 19 for recycle. The electrolyte thus flows through the opening 13a in anode 13 and flows upward through tank 11 and impinges on cathode 12 as it exits the tank 11. A flange or plate 30 holds cathode 12 in position. As shown in the figure, electrolyte contacts only the upper side of anode 13 and only the lower side 12a of cathode 12. The outlet electrolyte is recycled to holding tank 19. During operation of the plating system to plate cathode substrate 12 with a layer of copper, the electrolyte 27 is preferably continuously recycled through holding tank 19 and electroplating tank 11. This forms a substantially uniform electrolyte composition in the system and contributes to the overall effectiveness of the substrate plating.

During operation of the electroplating system 10, copper metal is plated on surface 12a of cathode substrate 12 when the rectifier 16 is energized. A pulse current, direct current, reverse periodic current or other suitable current may be employed. The temperature of the electrolyte may be maintained using a heater/cooler 22 whereby electrolyte 27 is removed from holding tank 19 and flows through line 23, heater/cooler 22 and then recycled to holding tank 19 through line 24.

It is an optional feature of the process that the plating system be controlled as described in U.S. Pat. No. 6,024,856 by removing a portion of the electrolyte from the system when a predetermined operating parameter (condition) is met and new electrolyte is added to the system either simultaneously or after the removal in substantially the same amount. The new electrolyte is preferably a single liquid containing all the materials needed to maintain the electroplating bath and system. The addition/removal system maintains a steady-state constant plating system having enhanced plating effects such as constant plating properties. With this system and method the plating bath reaches a steady state where bath components are substantially a steady-state value.

Figure 2:
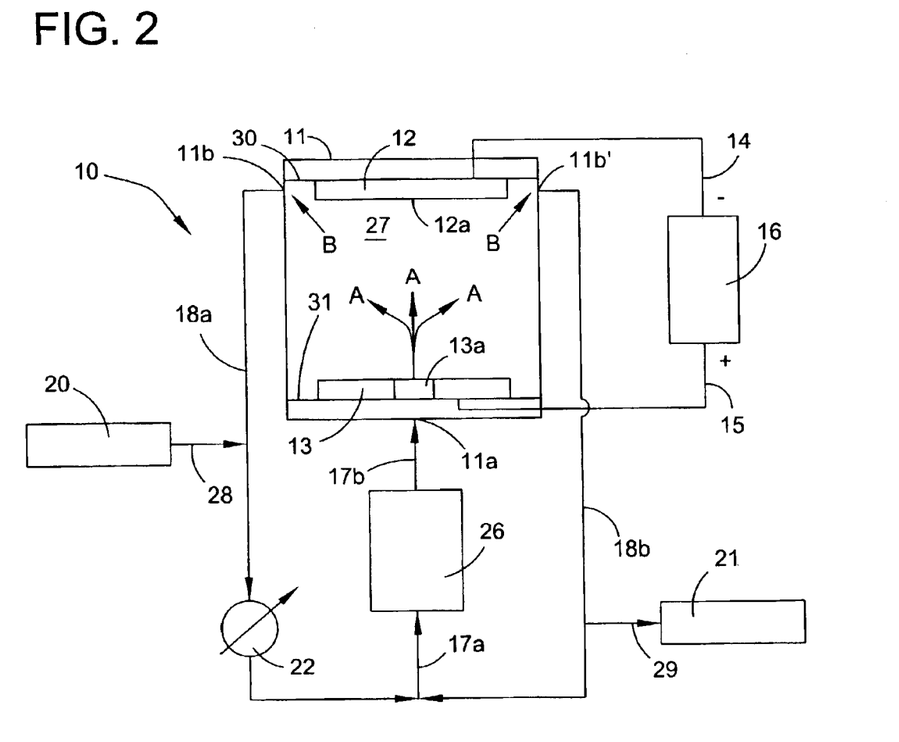
FIG. 2 is a schematic diagram of a preferred plating system in which the copper bath composition of the present invention may be used.

Referring now to FIG. 2, which shows another preferred plating system 10, the plating system 10 is similar to the plating system of FIG. 1 except that a holding tank 19 is not employed. Thus, an electroplating tank 11 has therein a horizontally disposed cathode 12 and anode 13 separated by a space. Electrolyte 27 in the tank is circulated through the tank and removed through outlet lines 18a and 18b. The outlet from the tank is recycled to the inlet of the tank through line 17a, filter 26 and line 17b into tank 11 at inlet 11a. The flow of electrolyte 27 into the tank is shown by arrows A and electrolyte flow to outlets 11b and 11b' past cathode 12 as shown by arrows B. Anode 13 has a central opening 13a.

As shown in both FIG. 1 and FIG. 2 when a predetermined operating parameter is reached, electrolyte 27 is removed from the apparatus through line 29 into tank or container 21 and a copper containing solution in tank 20 is fed into outlet line 18a through line 28. A heater or cooler 22 is shown employed in line 18a.

Figure 3:
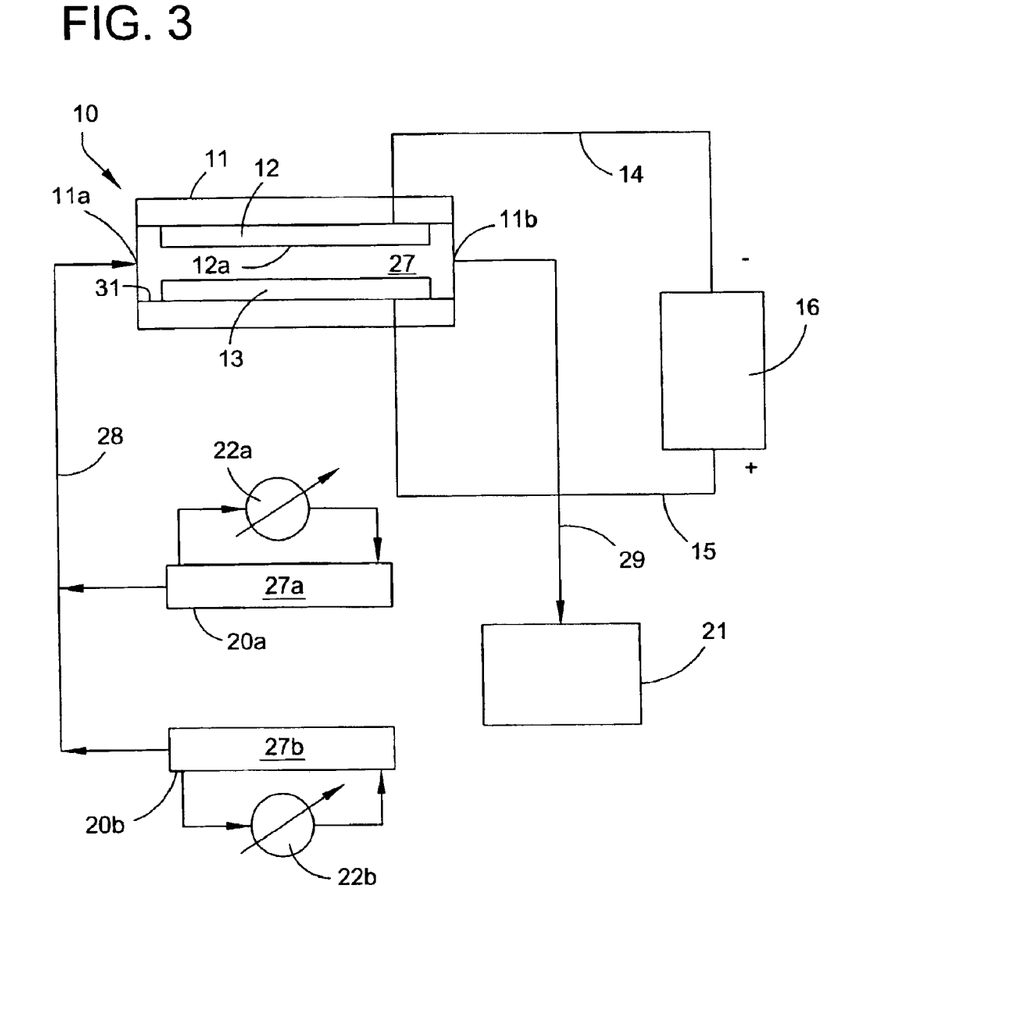
FIG. 3 is a schematic diagram of a preferred plating system in which the copper bath composition of the present invention may be used.

Referring now to FIG. 3, another preferred plating system 10 that is similar to the foregoing plating systems except that is designed to plate a wafer using a smaller volume of plating solution that is discarded after each wafer is plated rather than recirculating and/or recycling the plating solution. Advantageously, using this plating system allows every wafer to be plated with a volume of fresh copper plating solution thereby avoiding the build up of reaction products in the bath and allows for very consistent plate quality. This also substantially reduces the need for plating system analysis. To avoid an unacceptably large volume of waste, the electroplating tank 11 is preferably sized to use as little copper plating solution as necessary to adequately plate the wafer.

Although a single plating solution tank 20 may be used as depicted in FIGS. 1 and 2, the embodiment depicted in FIG. 3 uses multiple tanks 20a and 20b in order to keep one or more components of the electroplating solution that tend to react with each other (e.g., the copper and the reducing agent) separated until just before being used to plate. For example, a portion of the electroplating solution comprising copper 27a may be kept in tank 20a and heated using heater/cooler 22a and a portion of the electroplating solution comprising the reducing agent 27b may be kept in tank 20b and heated using heater/cooler 22b. When needed, the solution portions 27a and 27b are delivered through line 28 to the electroplating tank 11, the mixture is used to plate copper, and the solution after the plating operation is evacuated through line 29 to container 21. Although a recirculating flow of copper plating solution through the electroplating tank 11 may be used, the small size of the tank would most likely make it difficult to implement. Adequate mixing or agitation of the copper plating solution, however, can be achieved by the evolution of hydrogen during the electroless plating reaction and the spinning of the wafer while being plated (the wafer spins in most plating tools during the deposition process).

The steps in the invention of a) contacting the substrate with a copper plating solution to electrolessly deposit an electroless copper layer onto the substrate, and b) applying an external source of electrons to the copper plating solution to electrolytically deposit an electrolytic copper layer onto the electroless copper layer, can be carried out in the same vessel or in separate vessels. As such, applying electrons to the copper plating solution encompasses both the situation when it is the same bulk solution as the solution which was used in the electroless step, as well as the situation where it is a different bulk solution in a different vessel. Where the vessels are different, the respective bulk solutions comprise the same components, qualitatively and optionally quantitatively, i.e., water, copper ions, a complexing agent, hydroxide ions, a catalyst, a stabilizer to inhibit the formation of copper (I) oxide, and a reducing agent selected from the group consisting of glyoxylic acid, dimethylamine borane, hypophosphite, borohydride, and hydrazine. This distinct advantage of this process of having the flexibility to carry out the electroless and electrolytic processes in the same or different vessels is possible because the same solutions are used. When separate vessels are used, the fact that the electroless and electrolytic solutions comprise the same composition components qualitatively and optionally quantitatively has the distinct advantage of avoiding cross-contamination between solutions, so that thorough cleaning of the substrate between electroless and electrolytic deposition is not required. This improves efficiency because a cleaning step is avoided or reduced in scope, and reduces waste stream production.

EXAMPLE

An aqueous copper plating solution comprising: about 10 g/l of copper sulphate pentahydrate, about 14.4 g/l of EDTA, about 172 g/l of TMAH, about 7.4 g/l of glyoxylic acid, about 5 mg/l of 2,2'bipyridyl and 0.1 mg/l of 2-MTA was prepared and maintained at a temperature of about 70° C.

A silicon wafer with a 25 nm tantalum barrier layer and 250 nm vias was immersed in an alkaline cleaner, rinsed with water, immersed in a solution comprising about 80 g/l dimethylamine borane (at about 65° C.) for about 1 minute, and then rinsed with water. The wafer was then immersed in the copper plating solution (at about 70° C.) for about 1 minute to electrolessly deposit copper on the surface of the wafer. While still in the copper plating solution, a cathodic current was then applied to the wafer to electrolytically deposit copper on the wafer. The current density was maintained at 0.25 A/dm$^2$ for 30 seconds and then increased to 0.75 A/dm$^2$ for 3 minutes. The plated wafer was then removed from the copper plating solution, rinsed with water, and dried with hot air. The copper plating completely filled the vias and the adhesion of the copper plate was good.

It is to be understood that the above description is intended to be illustrative and not restrictive. Many embodiments will be apparent to those of skill in the art upon reading the above description. The scope of the invention should therefore be determined not with reference to the above description alone, but should also be determined with reference to the claims and the full scope of equivalents to which such claims are entitled.

What is claimed is:

1. A copper plating solution for electroless and electrolytic deposition of copper onto a surface of an integrated circuit semiconductor substrate, the copper plating solution comprising water, copper ions, hydroxide ions, a complexing agent to inhibit the formation of copper oxides, copper hydroxides and copper salts, a stabilizer to control the rate of electroless copper plating, a reducing agent to promote electroless reduction of the copper ions to copper metal, and a catalyst compound to promote electrolytic reduction of copper ions to copper metal.

2. The copper plating solution of claim 1 being substantially free of alkali metal atoms or ions.

3. The copper plating solution of claim 1 wherein the concentration of copper ions is between about 0.008 and about 0.08 M.

4. The copper plating solution of claim 1 wherein the concentration of copper ions is between about 0.02 and about 0.06 M.

5. The copper plating solution of claim 1 wherein the copper ions are supplied from a copper-containing sulphate, copper (II) chloride, copper (II) acetate, copper (II) nitrate, copper (II) carbonate, copper (II) hydroxide, copper (II) iodide, and hydrates thereof.

6. The copper plating solution of claim 5 wherein the copper-containing compound is copper (II) sulphate pentahydrate.

7. The copper plating solution of claim 1 wherein the reducing agent is free of formaldehyde.

8. The copper plating solution of claim 1 wherein the reducing agent is selected from the group consisting of glyoxylic acid, dimethylamine borane, hypophosphite, borohydride, and hydrazine.

9. The copper plating solution of claim 1 wherein the reducing agent is glyoxylic acid.

10. The copper plating solution of claim 9 wherein the concentration of glyoxylic acid is between about 0.027 and about 0.27 M.

11. The copper plating solution of claim 9 wherein the concentration of glyoxylic acid is between about 0.07 and about 0.14 M.

12. The copper plating solution of claim 1 wherein the complexing agent is selected from the group consisting of: ethylenediaminetetraacetic acid; a hydroxy lower alkyl lower alkalene amine, diamine, -triamine, -polyamine, or imine; a lower alkyl carboxylic acid lower alkylene amine, diamine, triamine, polyamine, or imine; a hydroxyalkyl or alkylene carboxylic acid amine, triamine, polyamine, or imine; a hydroxy mono-, di-, tri- or tetra-carboxylic acid, comprising a carbon atom other than in a carboxylic group; nitrilotriacetic acid; glycollic acid; iminodiacetic acid; a polyimine; and ethanolamine.

13. The copper plating solution of claim 12 wherein the complexing agent is ethylenediaminetetraacetic acid.

14. The copper plating solution of claim 13 wherein concentration of ethylenediaminetetraacetic acid is between about 0.012 and about 0.12 M.

15. The copper plating solution of claim 13 wherein concentration of ethylenediaminetetraacetic acid is between about 0.04 and about 0.08 M.

16. The copper plating solution of claim 13 wherein the molar ratio of copper ions to ethylenediaminetetraacetic acid is between about 1:1 and about 1:2.

17. The copper plating solution of claim 13 wherein the molar ratio of copper ions to ethylenediaminetetraacetic acid is between about 1:1 and about 1:1.5.

18. The copper plating solution of claim 13 wherein the hydroxide ions are from tetramethylammonium hydroxide.

19. The copper plating solution of claim 18 wherein the concentration of tetramethylammonium hydroxide is preferably between about 0.39 and about 2.64 M.

20. The copper plating solution of claim 18 wherein the concentration of tetramethylammonium hydroxide is preferably between about 1.20 and about 2.20 M.

21. The copper plating solution of claim 18 wherein the concentration of tetramethylammonium hydroxide is such that the copper plating solution comprises at least about 10 g/l of tetramethylammonium hydroxide that is unreacted after neutralization of acid in the copper plating solution.

22. The copper plating solution of claim 1 wherein the stabilizer comprises 2,2'bipyridyl.

23. The copper plating solution of claim 22 wherein the concentration of 2,2'bipyridyl is between about 0.006 and about 0.128 mM.

24. The copper plating solution of claim 22 wherein the concentration of 2,2'bipyridyl is between about 0.006 and about 0.064 mM.

25. The copper plating solution of claim 1 wherein the catalyst compound comprises 2-mercaptothiazoline.

26. The copper plating solution of claim 25 wherein the concentration of 2-mercaptothiazoline is less than about 0.84 mM.

27. The copper plating solution of claim 25 wherein the concentration of 2-mercaptothiazolifle is between about 0.0004 and about 0.004 mM.

28. A copper plating solution for electroless and electrolytic deposition of copper onto a surface of a substrate, the copper plating solution comprising:
water;
copper ions;
a complexing agent that is a hydroxy lower alkyl lower alkylene amine, diamine, triamine, polyamine, or imine;
a formaldehyde-free reducing agent to promote electroless reduction of the copper ions to copper metal;
an alkali metal-free hydroxide;
an organic nitrogen-containing compound selected from the group consisting of 2,2'bipyridyl, hydroxypyridine, and 2'2-dipyridylamine; and
an organic divalent sulfur-containing compound selected from the group consisting of 2-mercaptothiazoline, 2-mercaptobenzothiazole, 2-mercaptopyridine, and allyl thiourea.

29. The copper plating solution of claim 28 wherein the formaldehyde-free reducing agent is selected from the group consisting of glyoxylic acid, dimethylamine borane, hypophosphite, borohydride, and hydrazine, and the alkali metal-free hydroxide is tetramethylammonium hydroxide.

30. A copper plating solution for electroless and electrolytic deposition of copper onto a surface of a substrate, the copper plating solution comprising:
water;
copper ions at a concentration between about 0.02 and about 0.06 M;
ethylenediaminetetraacetic acid at a concentration between about 0.04 and about 0.08 M;
a molar ratio of copper ions to ethylenediaminetetraacetic acid that is between about 1:1 and about 1:1.5;
glyoxylic acid at a concentration between about 0.07 and about 0.14 M;
tetramethylammonium hydroxide at a concentration between about 1.20 and about 2.20 M with the concentration of tetramethylammonium hydroxide being such that the copper plating solution comprises at least about 10 g/l of tetramethylammonium hydroxide that is unreacted after neutralization of acid in the copper plating solution;
2,2'bipyridyl at a concentration between about 0.006 and about 0.064 mM; and 2-mercaptothiazoline at a concentration between about 0.0004 and about 0.004 mM.

31. A process for electroless plating of copper onto a surface of an integrated circuit semiconductor substrate, the process comprising:

contacting the surface with a copper plating solution to electrolessly deposit copper onto the surface of the integrated circuit semiconductor substrate, wherein the copper plating solution comprises water, copper ions, hydroxide ions, a complexing agent to inhibit the formation of copper oxides, copper hydroxides and copper salts, a stabilizer to control the rate of electroless copper plating, a reducing agent to promote electroless reduction of the copper ions to copper metal, and an electrolytic copper reduction catalyst compound.

32. The process of claim 31 comprising maintaining the copper plating solution at a temperature between about 20 and about 90° C.

33. The process of claim 31 comprising contacting the surface with the copper plating solution for a duration between about 10 seconds and 10 minutes.

34. The process of claim 31 wherein the copper deposits on the surface of the substrate at a rate between about 3 and about 13 $\mu$m/hr.

35. The process of claim 31 wherein the concentration of copper ions is between about 0.008 and about 0.08 M, the hydroxide ions are from tetramethylammonium hydroxide and the concentration of tetramethylammonium hydroxide is between about 0.39 and about 2.64 M, the complexing agent is ethylenediaminetetraacetic acid and the concentration of the ethylenediaminetetraacetic acid is between about 0.012 and about 0.12 M, the reducing agent is glyoxylic acid and the concentration of glyoxylic acid is between about 0.027 and about 0.27 M, the stabilizer is 2,2'bipyridyl and the concentration of 2,2'bipyridyl is between about 0.006 and about 0.128 mM, and the catalyst is 2-mercaptothiazoline and the concentration of 2-mercaptothiazoline is less than about 0.84 mM.

36. The process of claim 35 wherein the molar ratio of copper ions to ethylenediaminetetraacetic acid is between about 1:1 and about 1:2.

37. The process of claim 35 wherein the concentration of tetramethylammonium hydroxide is such that the copper plating solution comprises at least about 10 g/l of tetramethylammonium hydroxide that is unreacted after neutralization of acids in the copper plating solution.

38. A process for electroless plating of copper onto a surface of substrate, the process comprising:

contacting the surface with a copper plating solution to electrolessly deposit copper onto the surface of the substrate, wherein the copper plating solution comprises water, copper ions, a complexing agent that is a hydroxy lower alkyl lower alkylene amine, diamine, triamine, polyamine, or imine, a formaldehyde-free reducing agent to promote the electroless reduction of the copper ions to copper metal, an alkali metal-free hydroxide, an organic nitrogen-containing compound selected from the group consisting of 2,2'bipyridyl, hydroxypyridine, and 2'2-dipyridylamine, and an organic divalent sulfur-containing compound selected from the group consisting of 2-mercaptothiazoline, 2-mercaptobenzothiazole, 2-mercaptopyridine, and allyl thiourea.

39. A process for electrolytic plating of copper onto a surface of an integrated circuit semiconductor substrate, the process comprising:

contacting the surface with an electroless and electrolytic copper plating solution comprising water, copper ions, hydroxide ions, a complexing agent to inhibit the formation of copper oxides, copper hydroxides and copper salts, an electroless copper plating stabilizer, an electroless copper plating reducing agent, and a catalyst compound to promote electrolytic reduction copper ions to copper metal; and applying an external source of electrons to the copper plating solution to electrolytically deposit copper onto the surface.

40. The process of claim 39 wherein the supply of electrons has a current density between about 0.01 and about 5 A/dm$^2$.

41. The process of claim 39 wherein the supply of electrons has a current density between about 0.25 and about 1.0 A/dm$^2$.

42. The process of claim 39 wherein the catalyst compound is an organic divalent sulfur compound.

43. The process of claim 39 wherein the catalyst compound is 2-mercaptothiazoline.

44. The process of claim 43 wherein the concentration of 2-mercaptothiazoline in the electroless and electrolytic copper plating solution is less than about 0.84 mM.

45. The process of claim 43 wherein the concentration of 2-mercaptothiazoline in the electroless and electrolytic copper plating solution is between about 0.0004 and about 0.004 mM.

46. The process of claim 45 wherein the concentration of copper ions is between about 0.008 and about 0.08 M, the hydroxide ions are from tetramethylammonium hydroxide and the concentration of tetramethylammonium hydroxide is preferably between about 0.39 and about 2.64 M, the complexing agent is ethylenediaminetetraacetic acid and the concentration of the ethylenediaminetetraacetic acid is between about 0.012 and about 0.12 M, the reducing agent is glyoxylic acid and the concentration of glyoxylic acid is between about 0.027 and about 0.27 M, and the stabilizer is 2,2'bipyridyl and the concentration of 2,2'bipyridyl is between about 0.006 and about 0.128 mM.

47. The process of claim 43 wherein the concentration of 2-mercaptothiazoline in the electroless and electrolytic copper plating solution is between about 0.006 and about 0.128 mM.

48. A process for plating copper onto a substrate, the process comprising:

contacting the substrate with an electroless and electrolytic copper plating solution to electrolessly deposit an electroless copper layer onto the substrate, wherein the copper plating solution comprises water, copper ions, hydroxide ions, a complexing agent to inhibit the formation of copper oxides, copper hydroxides and copper salts, a stabilizer to control the rate of electroless copper plating, a reducing agent to promote the electroless reduction of the copper ions to copper metal, and a catalyst compound to promote the electrolytic reduction copper ions to copper metal; and applying an external source of electrons to the electroless and electrolytic copper plating solution to electrolytically deposit an electrolytic copper layer onto the electroless copper layer.

49. The process of claim 48 wherein the electroless copper layer is substantially continuous and has a thickness of at least about 0.005 $\mu$m.

50. The process of claim 48 wherein:

the substrate is an integrated circuit semiconductor substrate comprising unfilled submicron electrical interconnects;

the contacting the substrate with the electroless and electrolytic copper plating solution to electrolessly deposit the electroless copper layer onto the substrate step comprises depositing the electroless copper layer onto interior surfaces of the submicron electrical interconnects; and the applying the external source of electrons to the electroless and electrolytic copper plating solution to electrolytically deposit the electrolytic copper layer onto the electroless copper layer step comprises substantially filling the interconnects to provide an electrical connection therein.

51. The process of claim 48 wherein:

the contacting the substrate with the electroless and electrolytic copper plating solution to electrolessly deposit an electroless copper layer onto the substrate step is performed in a coating vessel; and the applying the external source of electrons to the electroless and electrolytic copper plating solution to electrolytically deposit the electrolytic copper layer onto the electroless copper layer step is performed in said coating vessel in which the contacting the substrate with the copper plating solution to electrolessly deposit is performed.

52. The process of claim 48 wherein the composition of the copper plating solution is not modified between the contacting the substrate with the copper plating solution to electrolessly deposit an electroless copper layer onto the substrate step and the applying the external source of electrons to the copper plating solution to deposit an electrolytic copper layer step.

53. The process of claim 48 wherein the concentration of copper ions is between about 0.008 and about 0.08 M, the hydroxide ions are from tetramethylammonium hydroxide and the concentration of tetramethylammonium hydroxide is preferably between about 0.39 and about 2.64 M, the complexing agent is ethylenediaminetetraacetic acid and the concentration of the ethylenediaminetetraacetic acid is between about 0.012 and about 0.12 M, the reducing agent is glyoxylic acid and the concentration of glyoxylic acid is between about 0.027 and about 0.27 M, the catalyst compound is 2-mercaptothiazoline and the concentration of 2-mercaptothiazoline is less than about 0.84 mM, and the stabilizer is 2,2'bipyridyl and the concentration of 2,2'bipyridyl is between about 0.006 and about 0.128 mM.

* * * * *

UNITED STATES PATENT AND TRADEMARK OFFICE
CERTIFICATE OF CORRECTION

PATENT NO. : 6,897,152 B2
DATED : May 24, 2005
INVENTOR(S) : Han Verbunt

It is certified that error appears in the above-identified patent and that said Letters Patent is hereby corrected as shown below:

Column 11,
Line 14, "copper-containing sulphate," should read -- copper-containing compound selected from the group consisting of copper (II) sulphate, --.

Column 12,
Line 20, "2-mercaptothiazolifle" should read -- 2-mercaptothiazoline --.

Signed and Sealed this

Eleventh Day of October , 2005

JON W. DUDAS
*Director of the United States Patent and Trademark Office*